(12) United States Patent
Li et al.

(10) Patent No.: US 9,329,986 B2
(45) Date of Patent: May 3, 2016

(54) PEAK CURRENT MANAGEMENT IN MULTI-DIE NON-VOLATILE MEMORY DEVICES

(71) Applicant: SanDisk Technologies Inc., Plano, TX (US)

(72) Inventors: Yan Li, Milpitas, CA (US); Yacov Duzly, Raanana (IL); Frank Wanfang Tsai, Mountain View, CA (US); Alon Marcu, Tel-Mond (IL)

(73) Assignee: SanDisk Technologies Inc., Plano, TX (US)

( * ) Notice: Subject to any disclaimer, the term of this patent is extended or adjusted under 35 U.S.C. 154(b) by 299 days.

(21) Appl. No.: 13/785,720

(22) Filed: Mar. 5, 2013

(65) Prior Publication Data

US 2014/0075133 A1 Mar. 13, 2014

Related U.S. Application Data

(60) Provisional application No. 61/699,052, filed on Sep. 10, 2012.

(51) Int. Cl.
*G06F 12/00* (2006.01)
*G11C 5/14* (2006.01)
*G11C 16/30* (2006.01)

(52) U.S. Cl.
CPC *G06F 12/00* (2013.01); *G11C 5/14* (2013.01); *G11C 16/30* (2013.01)

(58) Field of Classification Search
CPC .............. G06F 3/0679; G06F 3/0688; G06F 2212/2022; G06F 2212/222; G11C 5/14; G11C 5/147; G11C 16/30; G11C 11/1697; G11C 7/222

USPC .............. 711/103, 154; 365/228, 185.18, 194
See application file for complete search history.

(56) References Cited

U.S. PATENT DOCUMENTS

| | | | |
|---|---|---|---|
| 5,070,032 A | 12/1991 | Yuan et al. |
| 5,079,744 A | 1/1992 | Tobita et al. |
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |

(Continued)

FOREIGN PATENT DOCUMENTS

WO  WO 2012/015793 A1   2/2012

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Jasmine Song
(74) *Attorney, Agent, or Firm* — Sterne, Kessler, Goldstein & Fox PLLC

(57) ABSTRACT

Techniques are presented to operate a greater number of dice in parallel while not exceeding peak current limits. The device can arbitrate between multiple dice and, when needed, suspend operations on one or more dice in a way to average the chance of performance penalty so that all chips will proceed with write at an equal probability. In other aspects, the suspension of operations can be weighted based on factors such as the relative speed of the different dice or differing loads.

18 Claims, 15 Drawing Sheets

(56) References Cited

U.S. PATENT DOCUMENTS

| | | |
|---|---|---|
| 5,343,063 A | 8/1994 | Yuan et al. |
| 5,500,823 A | 3/1996 | Martin et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,206,230 B2 | 4/2007 | Li et al. |
| 7,283,410 B2 | 10/2007 | Hsu et al. |
| 8,111,577 B2 | 2/2012 | Sheets et al. |
| 8,902,662 B2 * | 12/2014 | Shiga et al. ............. 365/185.18 |
| 2006/0140007 A1 | 6/2006 | Cernea et al. |
| 2009/0089481 A1 | 4/2009 | Kapoor et al. |
| 2012/0167100 A1 | 6/2012 | Li |

OTHER PUBLICATIONS

U.S. Appl. No. 13/411,115, entitled "Saving of Data in Cases of Word-Line to Word-Line Short in Memory Arrays," filed Mar. 2, 2012, 82 pages.

U.S. Appl. No. 13/471,198, entitled "Memory Chip Power Management," filed May 14, 2012, 29 pages.

U.S. Appl. No. 13/559,377, entitled "Non-Volatile Memory and Method with Peak Current," filed Jul. 26, 2012, 31 pages.

U.S. Appl. No. 13/803,835 entitled "Immunity Against Temporary and Short Power Drops in Non-Volatile Memory," filed Mar. 14, 2013, 44 pages.

* cited by examiner

| State | Category | Pause/GO | Icc (mA) | Icc Index <1:0> |
|---|---|---|---|---|
| Wait/Idle | Low | Go | 0 | 000 |
| Detection | Medium | Go | 40 | 010 |
| BL Inhibit | High Peak | Wait on CMD | 160 | 100 |
| BL Charge | High Peak | Wait on CMD | 100 | 100 |
| SENSE | Medium | Go | 50 | 010 |
| SCAN | Medium | Go | | 010 |
| SENSE+SCAN | High | Wait on CMD | 130 | 110 |
| Other | Low | GO | 18 | 001 |

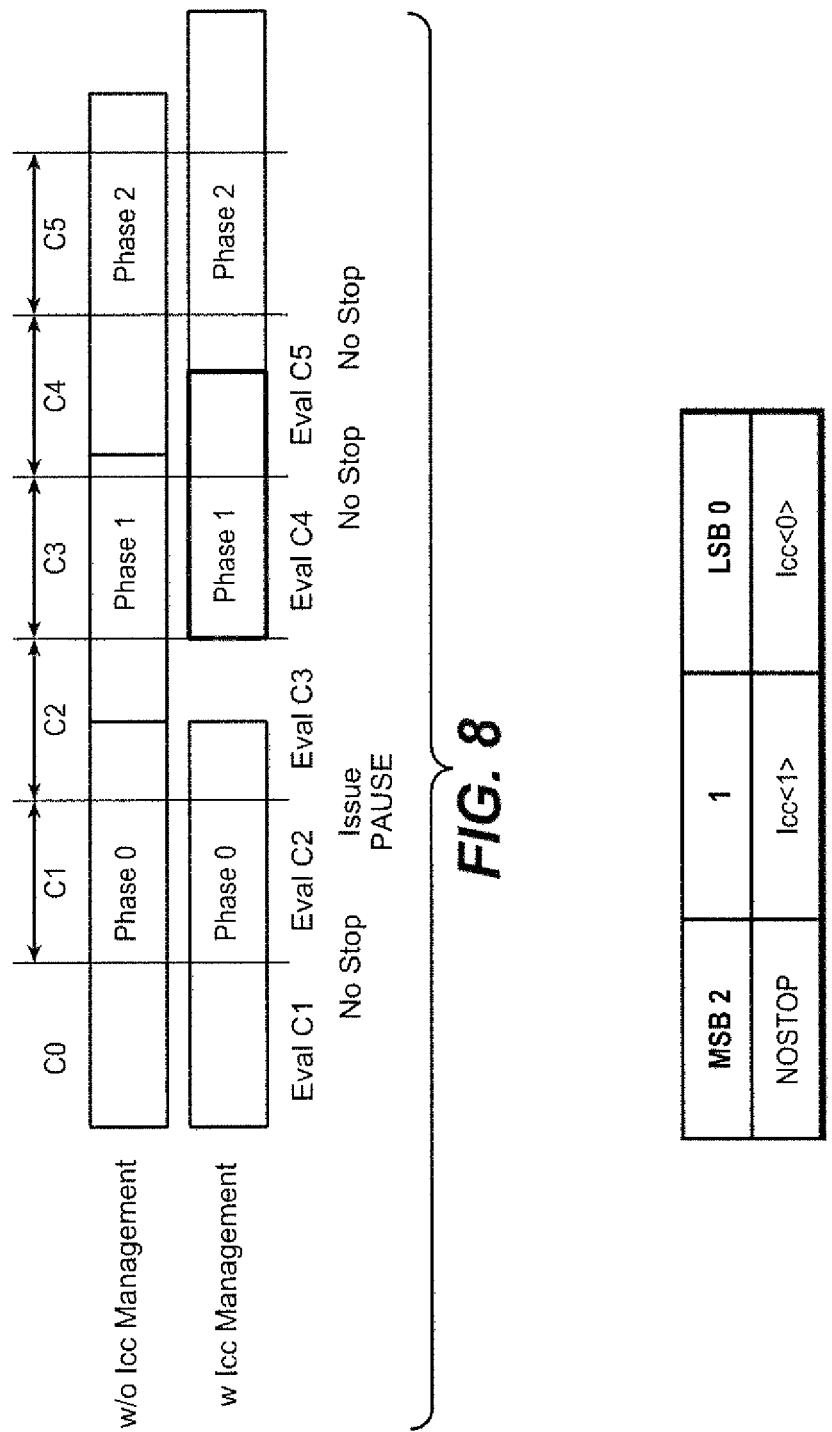

US 9,329,986 B2

PEAK CURRENT MANAGEMENT IN MULTI-DIE NON-VOLATILE MEMORY DEVICES

CROSS-REFERENCE TO RELATED APPLICATION

This application claims priority from, U.S. Provisional Applications Nos. 61/699,052, filed on Sep. 10, 2012, which is hereby incorporated in its entirety by this reference.

FIELD OF THE INVENTION

This invention relates generally to non-volatile semiconductor memory such as electrically erasable programmable read-only memory (EEPROM) and flash EEPROM, and specifically to techniques of dealing with current level fluctuations in multi-chip devices.

BACKGROUND OF THE INVENTION

Non-volatile memory devices, such as a flash memory card, are typically made of multiple memory chips packaged together with a controller chip. The performance of such devices can be increased by operating greater numbers of these memory chips in parallel. Such parallelism is usually constrained by the ability of a hosting device, such as a laptop computer, to supply power, both in terms of average power consumption levels and in terms of peak current levels. For example, a memory device may have four or eight memory chips and, in terms of average power consumption, could operate most or all of these in parallel; however, to be able to cover spikes in peak current levels, the device will often itself to operations on no more than two devices at the same time in order to avoid concurrent peaks in current demands that could exceed the supply's capability and lead to errors in operation. Consequently, these and similar devices would benefit from techniques to allow concurrent operations on more chips in parallel while still not exceeding the supply's ability to meet the device's requirements.

SUMMARY OF INVENTION

Techniques are presented to operate a greater number of dice in parallel while not exceeding peak current limits. The device can arbitrate between multiple dice and, when needed, suspend operations on one or more dice in a way to average the chance of performance penalty so that all chips will proceed with write at an equal probability. In other aspects, the suspension of operations can be weighted based on factors such as the relative speed of the different dice or differing loads.

According to a first set of aspects, a non-volatile memory system includes a plurality of non-volatile memory integrated circuits, a controller integrated circuit, a bus structure, and arbitration logic. The non-volatile memory integrated circuits each include one more memory arrays with read and write circuitry connected to them that operate according to a state machine formed the circuit. The state machine assigns an index corresponding to the amount of current expected to be drawn for upcoming operation of the circuit based on a phase of the state machine. The controller integrated circuit controls the transfer of data between the memory integrated circuits and a host device that is connected to memory system, and manages the storage of data upon the memory system. The bus structure is connected to the controller circuit and the memory circuits for the transfer of data and commands between them. The arbitration logic is connected to receive the indices assigned by the state machines, where the arbitration logic can selectively issue pause commands to the memory circuits based upon the indices in order to maintain current used by the system under a first value.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 8 is a representation of the pausing due to Icc management.

FIG. 9 is an example of an Icc format.

DESCRIPTION OF THE PREFERRED EMBODIMENTS

Icc Current Management in Multiple Die Using Icc Index

This section considers for dealing with peak or average current draws from the power supply (Icc) in the system operating multiple die in parallel. When the Icc peak or average values violate the power supply specification, the supply voltage (Vcc) can droop, resulting in operation failure. Techniques for dealing with such droops when they occur, as well as more detail on non-volatile memory devices in general, can be found in U.S. provisional patent application No. 61/612,540 and U.S. patent application Ser. No. 13/471,198, which are both incorporated here by reference. The focus here is on ways to preempt such occurrences. In the exemplary embodiments, algorithms can provide a clear priority to arbitrate between multiple dice and average the chance of performance penalty so that all chips can proceed to write with a more equal probability.

Figure 1A:
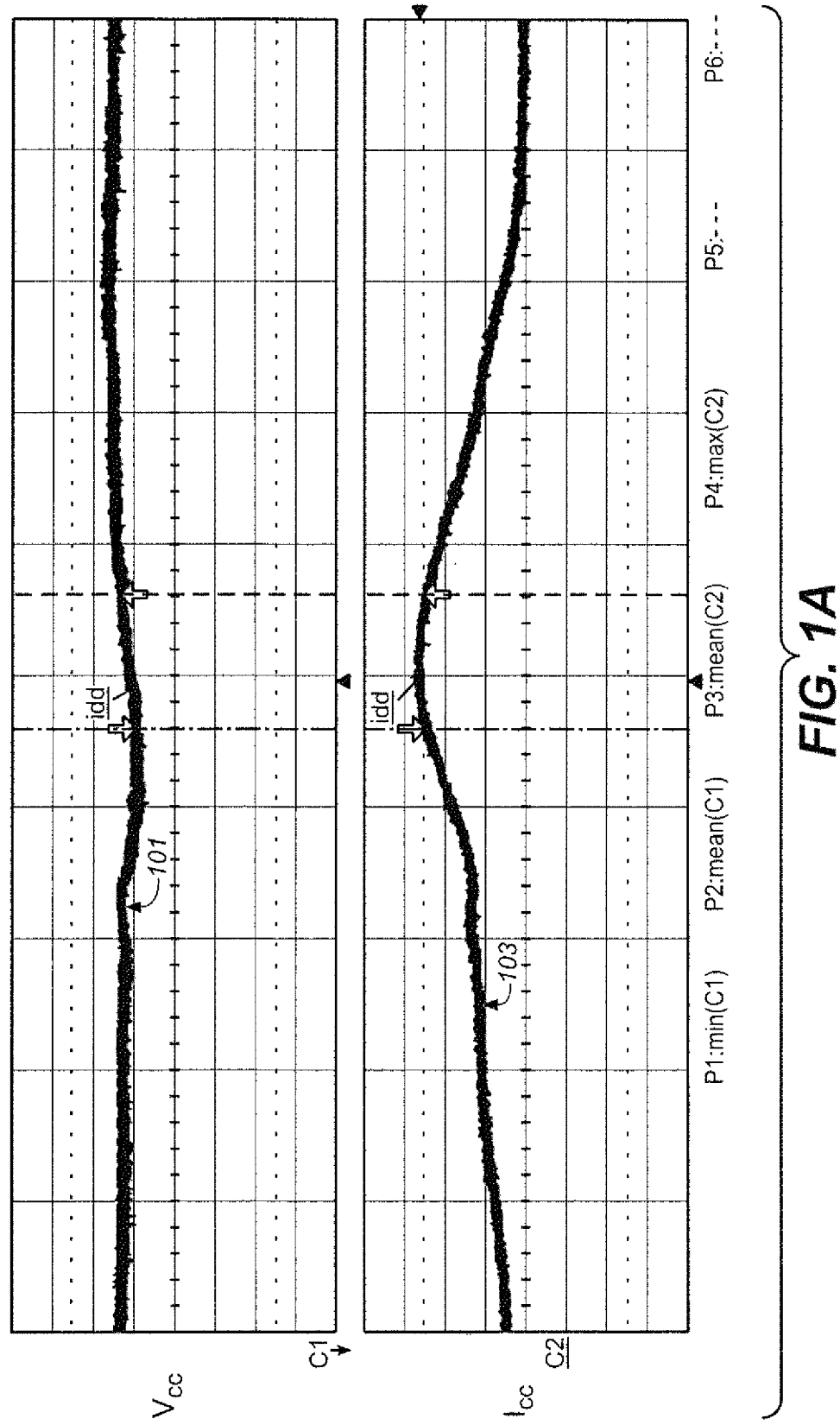
FIG. 1A illustrates how Icc peak levels can result in Vcc droop.
Figure 1B:
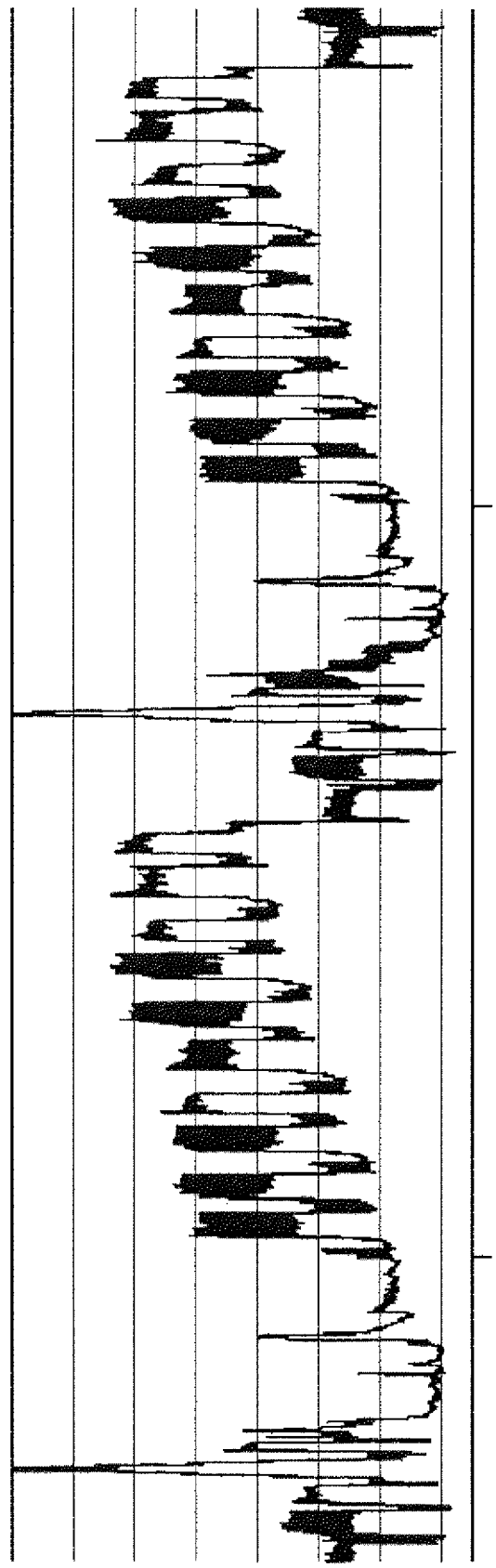
FIG. 1B is a more detailed Icc profile for a single die.

The situation can be illustrated with reference to FIG. 1A, which illustrates the current drawn during a write operation, where P1, P2, . . . are different phases of a programming (or other active) operation. As shown in FIG. 1A, during multi-die operations the Icc level at 103 may have Icc levels that exceed the power supply capability. This is shown between the vertical broken lines, where this causes the supply voltage Vcc at 101 to drop, which can lead to application failures. In some cases the supply level can droop to a voltage level which could lead to internal operations failing. FIG. 1A shows an Icc waveform in more detail over 2 cycles of program and verify for a single die. When the peaks of the individual dice line up, the Icc budget is then exceeded. These issues can limit multi-die parallel operations and limit performance enhancements that could be obtained from increasing the level of parallelism in operations. For example, in a package with 4 or 8 memory dice, the system cannot operate with 4 dice or 8 dice simultaneously to obtain higher performance due to worst case Icc peaks or average. Typically, such a system will operate no more than two dice simultaneously, which limits the possible amount that the performance can be improved.

As noted, previous approaches have typically applied a fixed limit on the number of dice that can operate concurrently and then, if needed, suspend operations after the Vcc droop detection. The methods of this section help to solve this problem by allowing more chips to operate concurrently by limiting Icc peak or average current by use of an algorithm to select chips to pause temporarily to avoid Icc over budget from different dice lining up. Broadly speaking, based on checking phase that each die is at in its operations, and knowledge of how much current such a phase tends to draw, the dice can selectively be paused. This is illustrated schematically in FIGS. 2A and 2B.

Figure 2A:
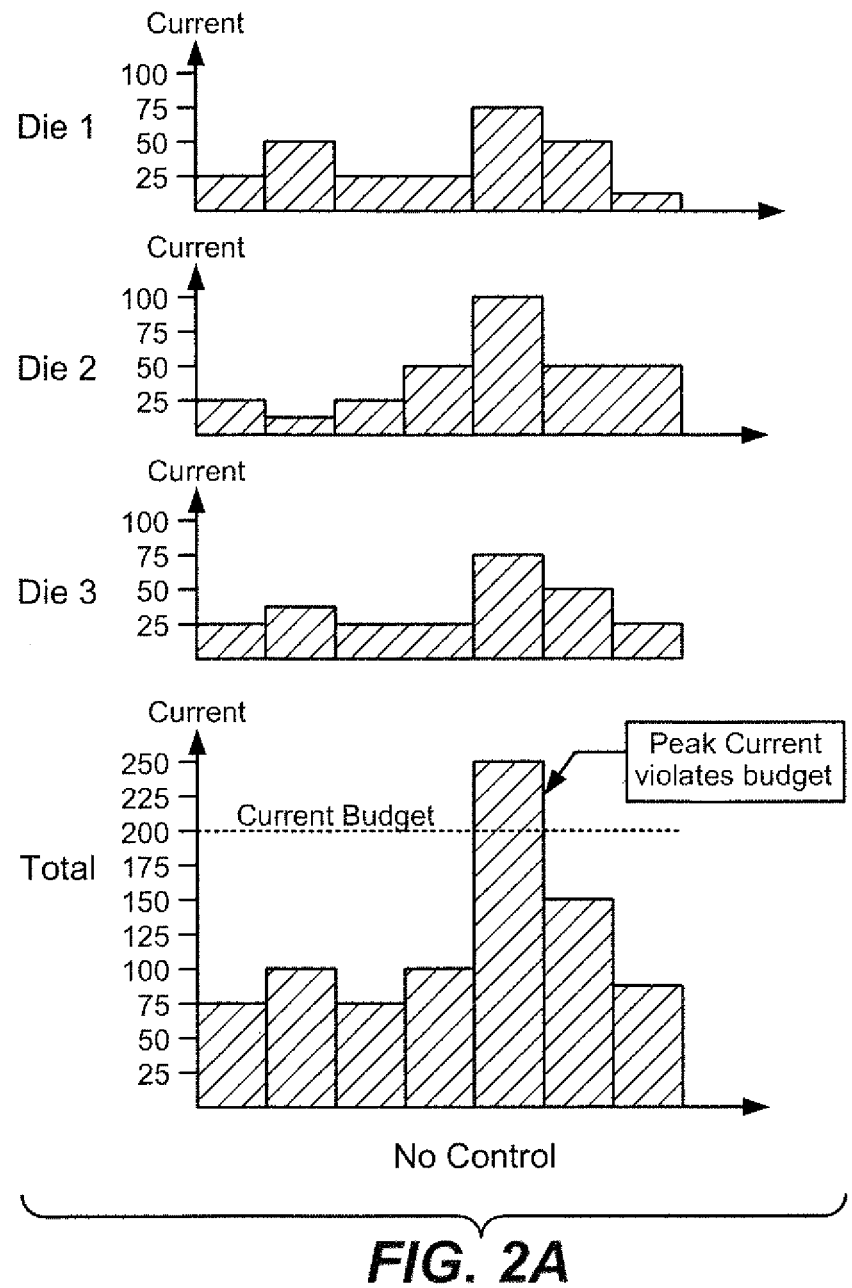
FIGS. 2A and 2B schematically illustrate the current drawn by 3 dice operating concurrently without and with, respectively, a pause and go operation being used.
Figure 2B:
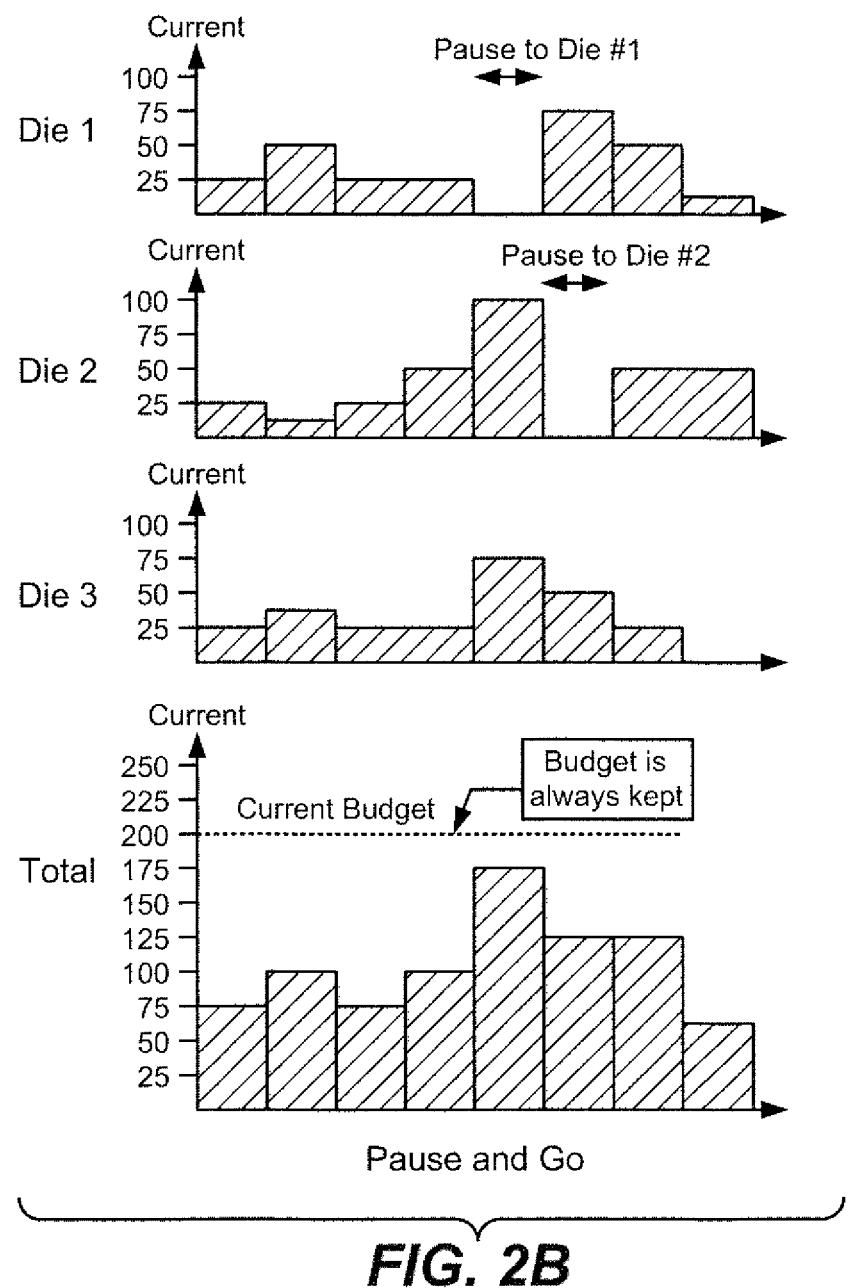

FIG. 2A shows the current drawn by 3 dice operating concurrently without the pause and go process being used, with the combined Icc drawn shown at bottom. In the one interval, the three dice have a coincident high current peak. As shown at bottom, the combined Icc used during this interval exceeds the budget. FIG. 2B shows the same dice performing the same operations, but with a pause and go algorithm now being used. In this example, in order to avoid exceeding the budget, Die 1 is paused briefly, thereby avoiding the budget exceeding peak of FIG. 2A, before resuming. To avoid exceeding Icc budget in the next interval, Die 2 is then paused. This allows for the combined Icc level to stay under budget, while still allowing three dice to operate in parallel. Although these pauses slow operation a little due to the pauses, it will still be faster than restricting operations to a fixed maximum of two dice.

The performance penalty caused by this can be minimized by a smart algorithm. More specifically, in the exemplary embodiment is based on forecasting a chip's Icc before a cycle starts. The system or sub-system assigns an Icc index based on the state machine phases, where the amount of current assigned to a given phase can be based on data collected in device characterization processes. The controller can fetch the Icc Index from each die for the current and next cycles by snooping the status with fixed interval even during data transmission. (A protocol for this process is discussed below.) After the evaluation of the Icc index by controller using an arbiter algorithm, the controller can issue Go/PAUSE commands to each die. For reducing the performance impact on wasted cycles, ¼ of the phase, for example, can be continued with an GO command, while ¾ phases can go without command. In this way, a device in a 4 or 8 memory dice package can be managed for average and peak Icc. Although this can result in the number of active dice being limited to less than 4 or 8 at times during high Icc, this will still lead to better performance that a fixed limit of, say, 2 dice. During low Icc phases, it may activate all 4 or 8 dice to do parallel operations.

Figure 3:
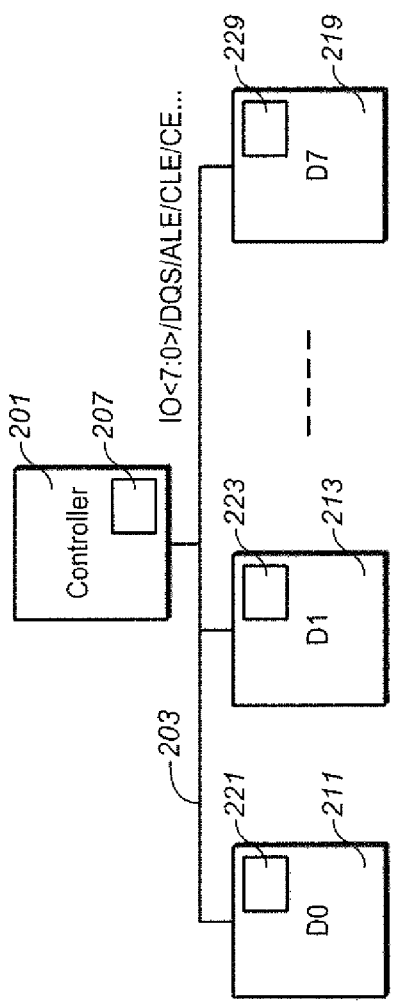
FIG. 3 is a box diagram of a multi-die memory device.

FIG. 3 is a simplified diagram of a memory device, although this invention is not limited to memory system as long as there is a master device to control multiple slave devices. As illustrated in FIG. 3, the controller 201, on which is the arbiter logic 207, and a number of memory devices D0 211, D1 1 213, . . . , D7 219, each with a state machine 221, 223, . . . , 229, communicate over a common bus 203. In the exemplary embodiment, the Icc index is checked using periodic snooping over the normal IO interface, where the system may stop data transmission periodically during data transmission phase. (In exemplary device, this snooping with 8 dice will take only something like 300 ns total.) The snooping during transmission temporarily suspends (with a suspend command) the transmission and resume the transmission with a command afterwards. Upon resuming data transmission, the column address does not need to be input, with the process taking up where it left off.

Although the exemplary embodiment described here uses the controller as a master for the process, in an alternate embodiment, the Icc peak or average is managed using one of the NAND chip (or slave device) as the master. The arbiter logic 207 can be built in each NAND chip. The D0 211, for example, can act as a master to communicate with rest of the dice to fetch the index from each Dice and issue PAUSE commands to each die. Another variation is, rather than use the normal IO bus, an additional path can be added; for example, each memory die may have an extra pin used for post-manufacturing tests, but which is unused once the dice are packaged in a device and this extra IO pin could be adapted to this purpose.

Figure 4:
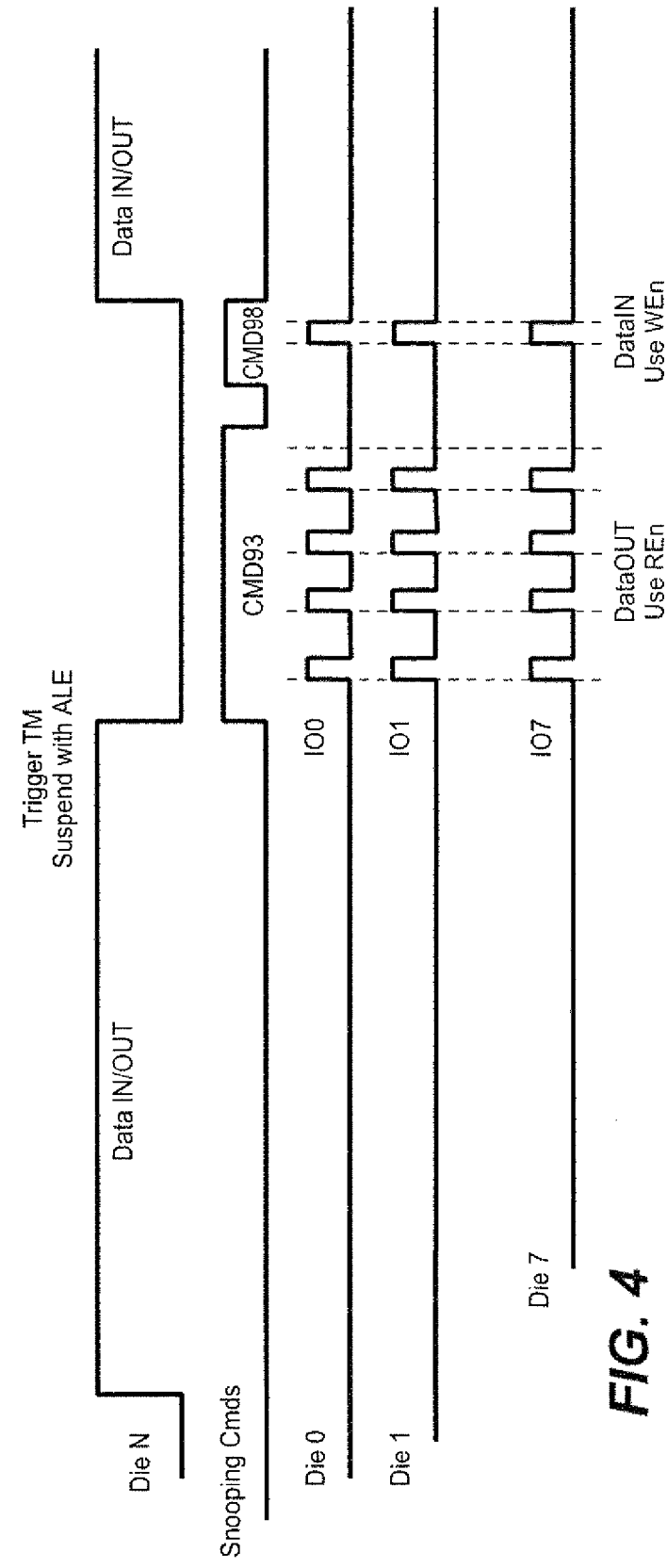
FIG. 4 is a set of waveforms to show snooping during a transmission suspension.

The snooping process during a transmission suspend can be illustrated further with respect to FIG. 4. Initially, data is being transferred between the controller on Die N on the IO bus. A command (CMD 93) can then be issued to trigger the suspend. After this suspend command, the transfer process will be disabled, triggered by the address latch enable (ALE) signal. The fetching of the Icc index can be done by toggling out of memory die using read enable (REn) toggle, where each die will activate only one IO line. The issue Pause/Go commands can be done with a command (CMD98) following data in with a write enable (WEn), with each chip only accepting one IO. When resuming, a corresponding command will be issued to enable the die selection, with other corresponding commands for resuming data in and resuming data out. The column address pointer and data in the pipeline will be kept during this suspend. The Icc indices can be read out in different ways: in FIG. 4, these are read out in parallel a bit at a time from each die; alternate, this could go sequentially through all of the dice reading out all of the bits of each index at once.

Figure 5:
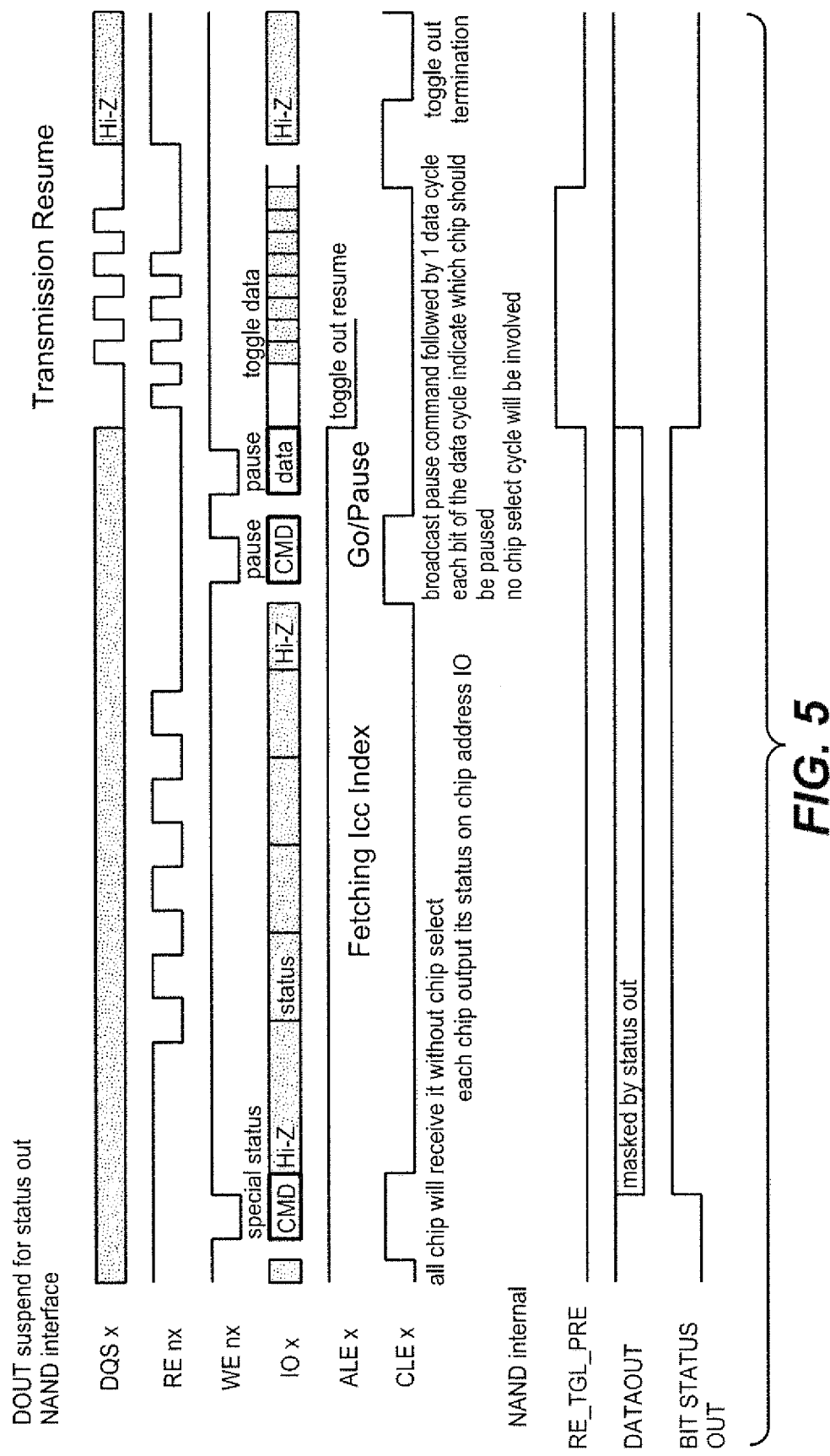
FIG. 5 is set of waveforms illustrating a snooping protocol in toggle mode.

The implementation of the snooping protocol in high speed IO interface toggle mode on the memory chips can be illustrated with respect to FIG. 5. Use CLE or ALE (Chip Latch Enable or Address Latch Enable) to suspend toggle mode during transmission. Specific commands will enable all dice and fetch the Icc index (status), where each die will drive one IO line. The controller will issue Go/Pause commands to all die, with each die accepting the corresponding one of the IO lines. The column address will be auto resumed, with no need for user to re-enter the column address.

Figures 6, 7:
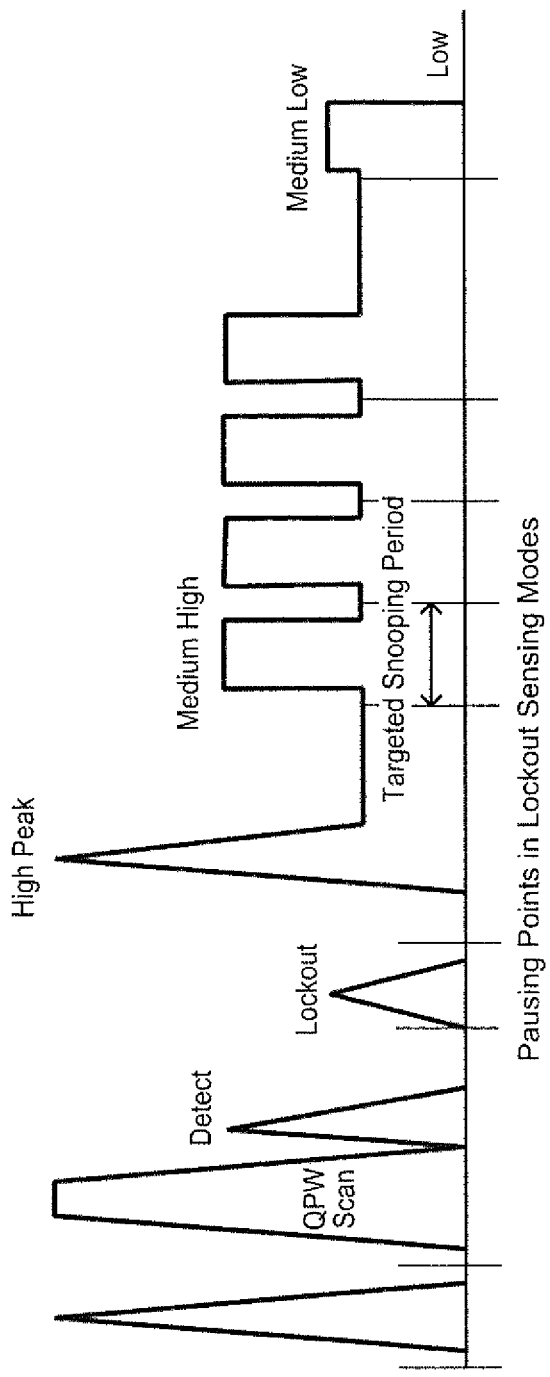
FIG. 6 are respectively Icc profiles in a simplified form and as taken from an actual device.
FIG. 7 is an exemplary Icc index table.

FIG. 6 is a simplified Icc profile to illustrate stop/go priority and algorithm prediction, where an actual waveform from a specific device was given in FIG. 1A for reference. In terms of stop/go priority, the system has:

1) High Peak—has to start with a GO command;
2) Medium—Go to transition (based on 4 die max), where this medium level could be stopped and always GO with next starting phase if more dice are operated in parallel or Icc spec is very low;
3) Low—go to transition phase;
4) Idle/stop—anytime auto GO.

During the program phase, there is a high peak for bit line pre-charge for inhibit. This peak may not last very long, so this is a high peak phase. Before the real high-voltage program phase, data transfers between different data latches will incur high current which could last 3-5 us, which is also high current phase. When the high voltage program has started, there is a detection happening at the same time, whose peak is medium level and does not last very long. At the end of the program phase, the high voltages are discharged, which is low current phase. After the program phase is the lockout phase where the inhibit bits data are transferred to a sense amplifier latch for inhibit. This peak is also medium level.

At the beginning of the program verify phase, there is a high peak of short duration due to pre-charge all the bit lines before the sensing. This is a high peak phase but the time is short. After the initial bit line pre-charge, the bit lines are continuously charged to reach stable for sensing, a phase that has medium Icc with long time. After the sensing, the newly sensed result will be in the sense amplifier latch waiting to transfer out. At the same time, the bit lines are continuously charged. The data transfer on top of the bit line charging time will end up with a high Icc period which last 3-5 us. After this data transfer time, another sensing could happen, where the bit line charging time for stability is a medium Icc period. Another data transfer will occur with high Icc phase. The number of high Icc data transfers will be depend on the number of verifies needed for this cycle of operations. The number of verifies depend on two indicators: 1) the starting point of each verify; 2) the completion point of each verify. These two indicators can be provided by the state machine to predict how many verifies in each cycle. After all the sensing for all the verifies finish, the bit lines are discharged. The last data transfer only has medium current.

The cycles of program and verify will continue until all the states finishing program. For algorithm prediction, the system can use the following to predict the next phase:

1) Verify—how many verifies are in the current stage and how many states are finishing programming;
2) Program pulse—use the state machine CLK signal to predict Icc index.

FIG. 7 is a table illustrating an example of Icc index assignments. For different states, in addition to the index, the corresponding category, whether it gets paused, and current drawn is also shown. FIG. 8 shows how the phases proceed without Icc management at top, and then with Icc management at bottom. The index is send by the state machine for both current and next state. Before a high current event, the controller will issue a PAUSE and the die will wait for the next cycle to resume. For low current events, the controller can issue a GO (the index reflects 1 bit for no stop) or the subsystem will GO by itself.

FIG. 9 is an example of a format for the Icc index. The Icc_index<1:0> is here defined as: If current state is a wait state, then use NextState Icc index at snooping time; if current state is not a wait state, use CurrentState Icc at snooping time. For NOSTOP, the phase cannot be stopped, but Current state Icc index will be taken in for the Icc target calculation, with the next state Icc ignored. In the case that the current phase is near finishing, say within 1 us (this can be a settable parameter), the next phase will be considered as the coming state. More generally, additionally fields can also be included for the interface between the memory circuit and the arbiter. For example, these can include one or more of:

Priority—this field can express the priority in pause and go mechanism;
IO current (IOC)—this field indicates that there additional high current on the NAND IO in addition to NAND core current;
R/W—a Read/Write indication; and
Cycle Number—the occurrence number of a specific state since an operation started (for example, the fifth program verify for a particular state in a programming subphase).

Figure 10:
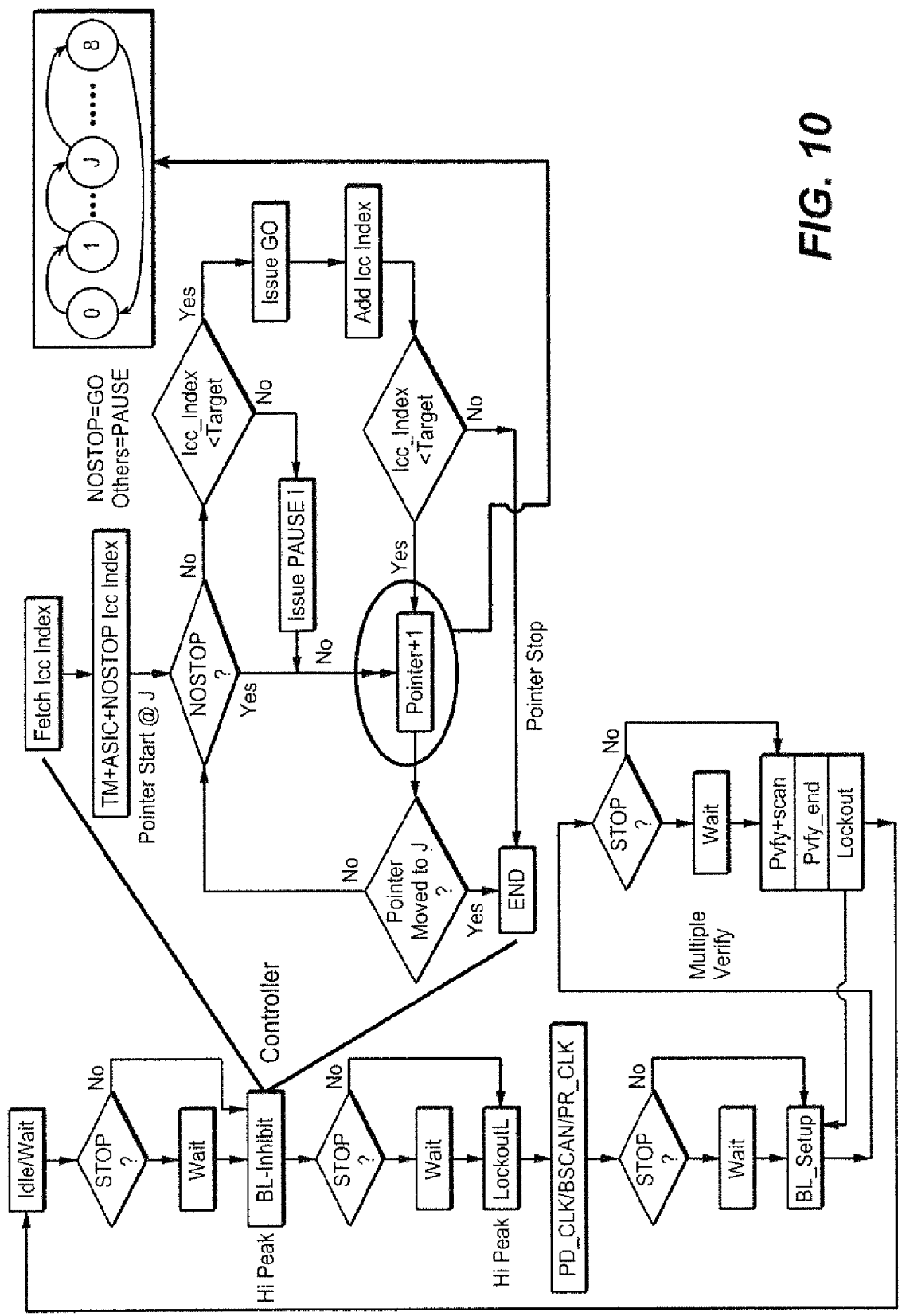
FIG. 10 is an exemplary controller arbiter algorithm.

FIG. 10 illustrates a first exemplary embodiment of a controller arbiter algorithm using a round robin arrangement for selecting which dice are to be paused. The left side of the flow shows the sequence of phases as set by the state machine on a memory die. This is more or less standard, except for the addition of multiple points between phases where the flow can be paused, as illustrated by the "STOP?" decision boxes, followed by the Wait if the die is paused. To the right is the process on the controller for fetching the Icc indices and determining whether to pause one or more dice, where the selection is made based by cycling through the dice cycling until a sufficient number have been paused to meet the target level. The controller will get the 3-4 bits Icc index from the memory chips. As the any data transfer on the IO bus and other operations on the system will also use current, the base line of the starting Icc index including the data transfer Icc Portion™; the controller Icc portion (ASIC) and the non-stoppable memory Tee portion. These Icc indices are then added together and from this information, the controller issues the determined pause commands to specific dice. By using a pointer to cycle through the dice to make the selections, the pointer will see that the pauses are equally distributed. The judgment to start from die J is the left over point from last decision point. If the Die J is the NOSTOP phase, the pointer will add one to next J+1 dice. If the die J is not a NOSTOP phase, it will be judged based on the coming Icc phase. If adding this die's Icc will not exceed Icc budget, then issue GO for this die. If adding this die's Icc will exceed the Icc budget, a PAUSE command will be issued to this die. After the GO command is issued to the die, the total Icc will be added for all the GO dice and compared with the Icc target. If the Icc target is exceeded, the arbiter algorithm will be terminated to end. This last step judgment against the target Icc is to preserve the stopping point for the next time starting time. The PAUSE and GO commands are initialize in the way that the NOSTOP die is start with a GO and all others start with PAUSE cmd. To prevent looping the pointer for multiple time, the pointer will stop when it loop to the initial starting pointer J.

Figure 11:
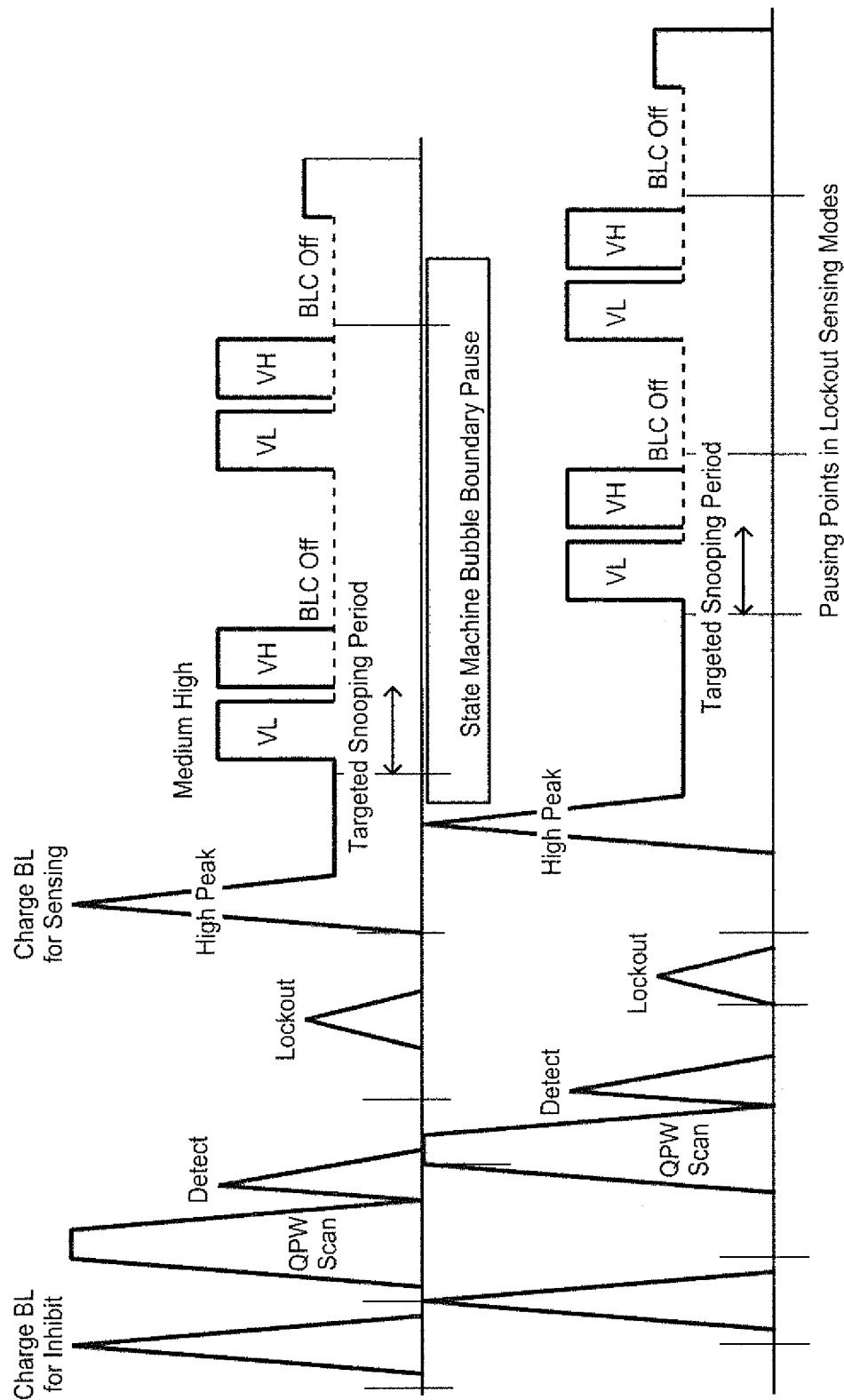
FIG. 11 is an example of Icc stager with management.

FIG. 11 schematically illustrates an example of Icc staggering between dice to help avoid Icc peaks lining up. The snooping period (5 us, for example) could be small compared with the stoppable point (say 10-20 us) to reduce inefficiency. The stoppable point is where the NAND operations can be paused without an Icc penalty. (Preferably lockout sensing is used to reduce current draw.) An advantage of frequent NAND Icc status snooping is to boost performance when compared with only pausing before programming pulses.

Figure 12:
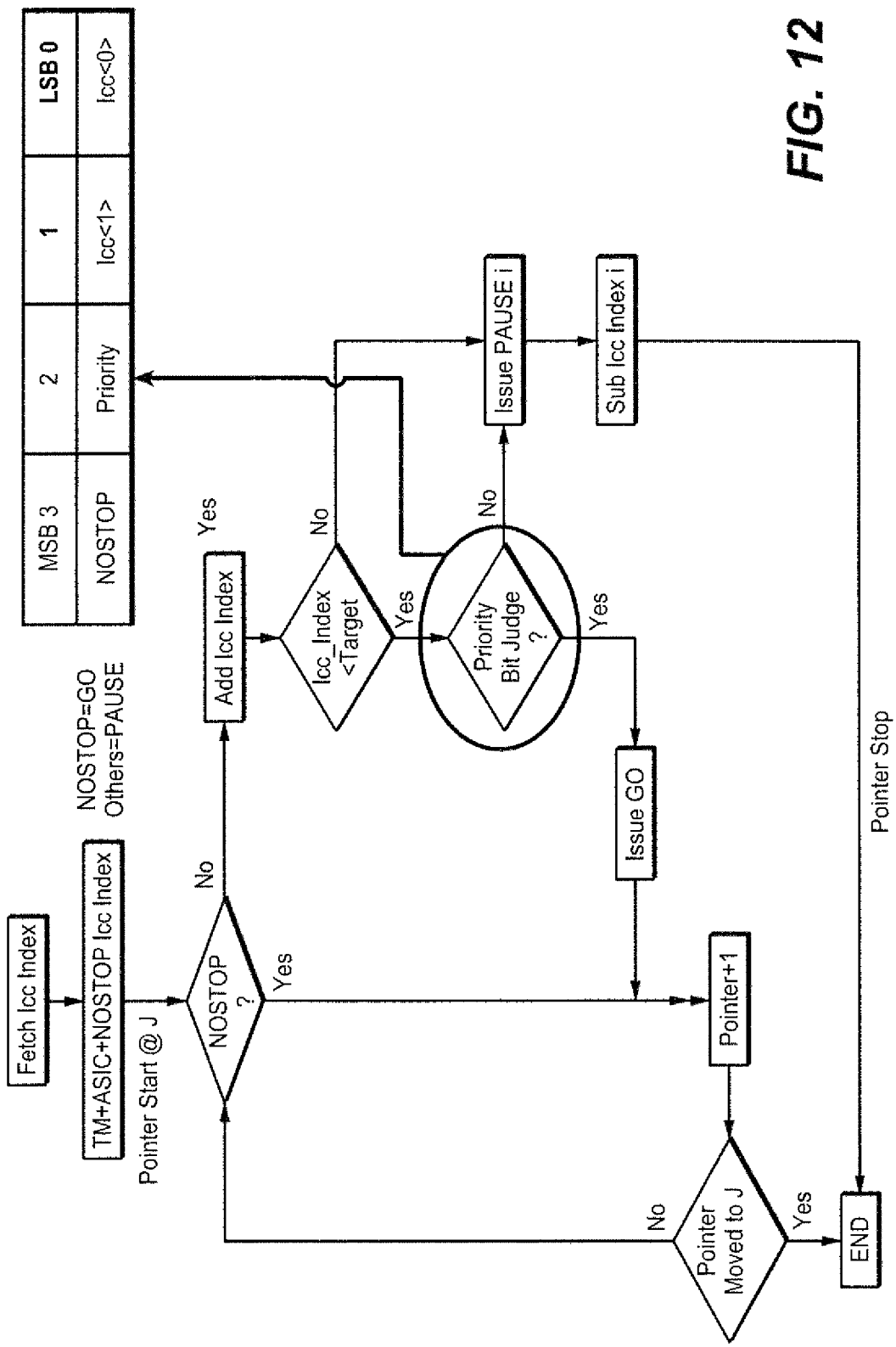
FIG. 12 is a flow incorporating a priority bit judgment and write speed modulation.

A number of priority variations within these structures are possible. Examples of these are write speed modulations or other priority operations such as read or erase, which can be illustrated with respect to FIG. 12. FIG. 12 corresponds to the left side (controller part) of FIG. 10, but now includes a "priority bit judgment" decision. A bit for this purpose can be added to the Icc index, as shown off to the top left of FIG. 12. It is preferable to finish all chips at the same time, as opposed to having one or more chips lag behind, slowing overall system performance. Program speed can be judged with the A state (lowest, non-erased state) completion point. If the A state did not complete for all the devices, the memory device can assign priority bit=1, which means every die has same priority to continue; if the A state finished programming for some devices, the corresponding device would set priority bit=0 which indicate this device has lower priority. Even though the individual memory devices have provided a priority bit, the decision making is dependent on the controller. If the controller has evaluated some memory devices as having finished A state programming, say somewhere between 50% and 100% of the total memory device, then the controller will give high priority to issue GO to the devices which did not finish A state programming so that the slow devices can speed up. In the flow chart of FIG. 12, when each die is evaluated by Icc_index<Target, the higher priority dice will be given a GO command. The low priority die will be given a PAUSE even though the Icc target would allow this die to GO. Thus in this embodiment, the dice are arranged with the following priority to GO: a) Highest priority is NOSTOP; b) then medium priority is the die is selected to be priority=1; c) the lowest priority is the dice can get GO if the Icc target is not met yet. This arrangement can be extended to add other priority algorithms, where, for example, normal NAND status can be used in the priority algorithm.

So far, the discussion has considered program operations, but the techniques can also be extended to other multi-die operations. Icc indices can be assigned to read and erase as well as program operations. The same algorithm can then be applied to judge the GO and PAUSE decisions. As an erase cannot readily be paused, it is assigned a higher priority (nostop=1). In some cases, the erase operation can be suspended if other operations, such as binary program, are needed urgently by controller. Read operations may also take higher priority, since host expect to finish fast (nostop=1). Program will take a lower priority, being pause to accommodate the Icc requirement. Additionally, differential limits on parallel operations can be applied, where, for example, only 4 die parallel program may be allowed, but with no limitation on erase or read operations.

The sort of round robin arbiter algorithm described above is generally preferred, but it may be paused due to many small Icc dice before a high Icc dice eventually gets paused to meet the Icc target, whereas if this high Icc die was paused first, it would meet the limit without pauses any other dice. An alternate arbiter algorithm can resolve this issue by sorting on the index first and finding the die with the highest Icc peak first and issue a PAUSE on that die. This way the priority to pause is issued to the highest Icc dice. If there is more than 1 die at the highest peak, the first one can be taken to pause.

So far the discussion of Icc current management focused on peak Icc levels, but it is also applicable to average Icc management. Application of such algorithms to average current levels can, at simplified level, be considered as using longer sampling periods than what are used in the peak current case, as can be illustrated by FIG. 13.

Figure 13:
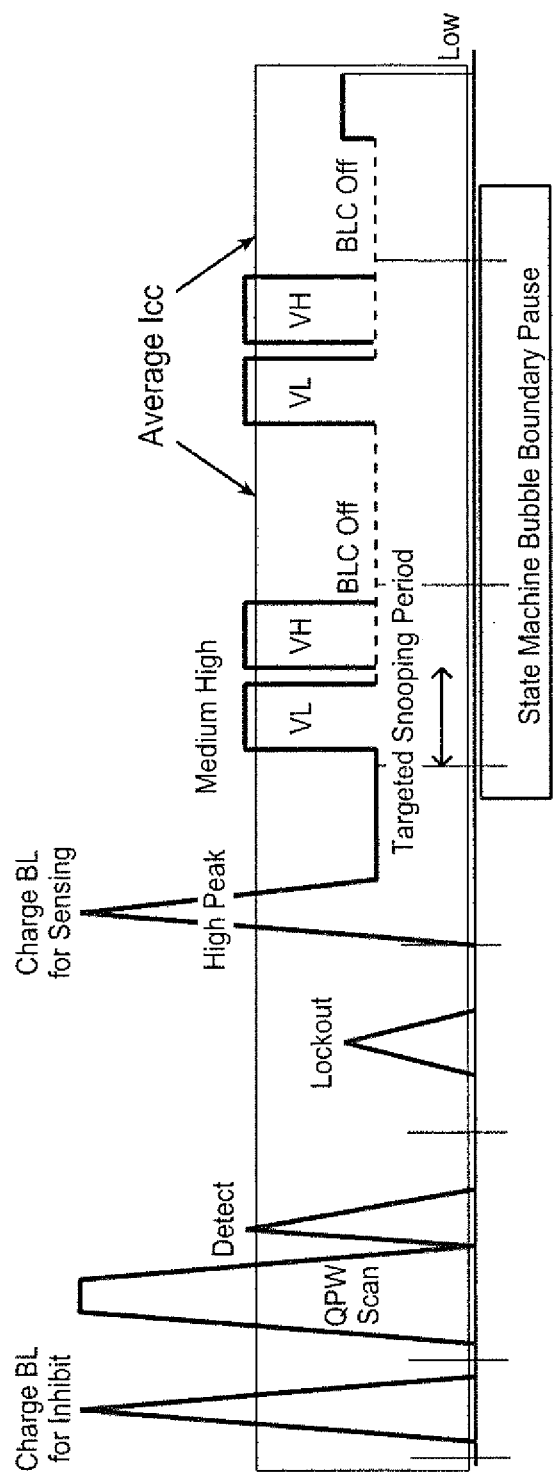
FIG. 13 illustrates the use of an averaged Icc management process.
Figure 14:
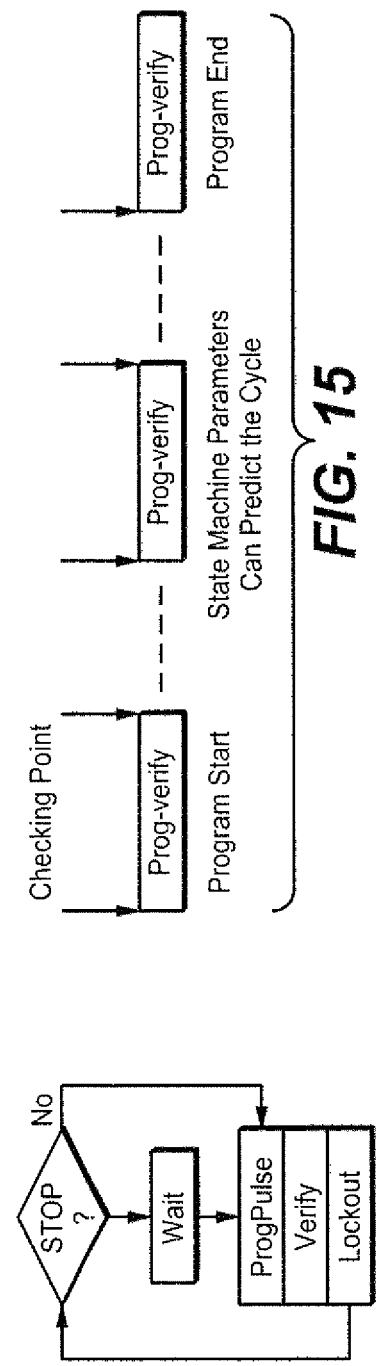
FIG. 14 is a flowchart for an example of average Icc management.

For simplified management, the controller (or master) can look at the NAND operation as average Icc, as shown in FIG. 13 for the same simplified Icc profile as in FIG. 6. By extending the period used, the Icc index only reflects the average Icc over the longer period. The average Icc may not be communicated to controller, and the controller can assume a fixed Icc number when the die is known to be operation in program, read or erase modes. For this process, the snooping can be less frequently. In using the longer period, the memory chip will not be paused stop until it finishes a full cycle of program and verify, as shown in the exemplary flow of FIG. 14. The arbiter algorithm can also be simplified. Under the exemplary embodiment, the controller has no need to fetch the Icc index (the Icc index is assumed to be the average value), but only issue GO/PAUSE commands to dice.

Figure 15:
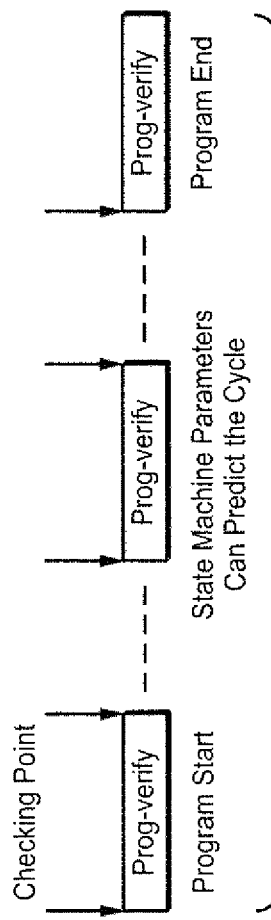
FIG. 15 schematically illustrates the checking points for the average Icc case.
Figure 17:
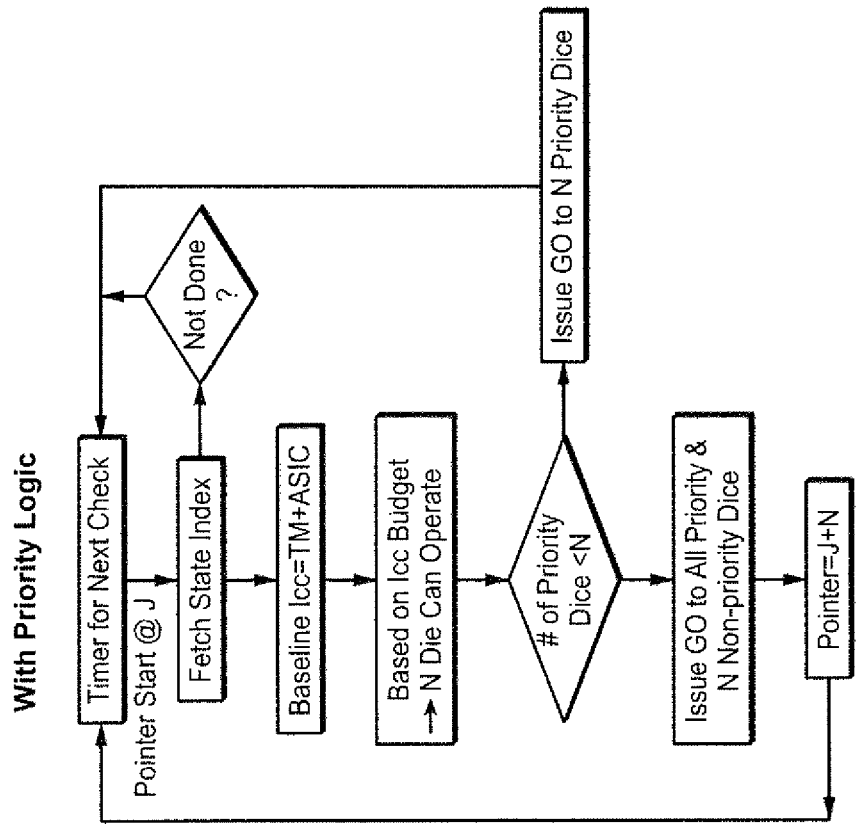
FIGS. 16 and 17 are flowcharts for the determination and issuance of pause commands respectively without and with the inclusion of priority logic for the average Icc case.
Figure 16:
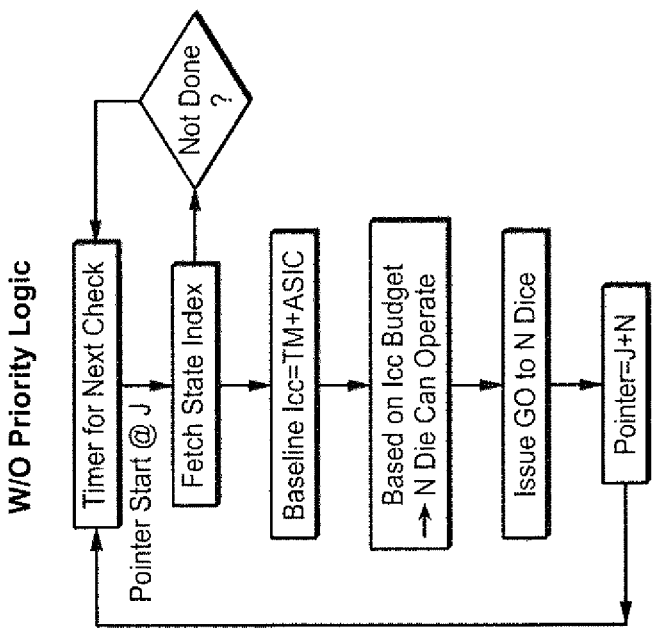

Average Icc management is consider further in FIGS. 15-17. FIG. 15 schematically illustrates how the checking points for the average Icc case can be based on the program-verify cycle, rather than the shorter phases used in the peak Icc case. Here the checking would be around 100 us, for example. FIGS. 16 and 17 are flowcharts for the determination and issuance of pause commands respectively without and with the inclusion of priority logic for the average Icc case. The number of die that are allowed to GO is calculated based on the Icc total budget in both cases. In the arbiter with priority, priority die are let GO first, where the priority is set based on each die's state index.

In FIG. 16, the controller algorithm starts with a timer to track the time elapsed since the last snooping. The length of the waiting time also depends on how many verifies are in this program-verify cycle. The number of verifies in this cycle is determined by the state machine parameters which communicated to controller through status checking. The parameters can include the starting indicator of the program verifies and the finishing indicators of each program verifies. At the next snooping point, the pointer may start at die J. The state index or status will be fetched first to evaluate the program stage of each dice. Then the number of dice need to GO is determined by the total Icc budget subtracted from the data transfer Icc™ and the ASIC Icc. The consecutive N dice will be issued to GO. The pointer will move to J+N for next evaluation. This will guarantee the fairness of the algorithm. During snooping time, the program cycle does not need to be completed. The evaluation and GO commands are issued for next phase, since the state completion is done in the program pulse which is in the first half of the program verify cycle. All the GO dice can be also staggered for 5 us from each other to avoid Icc peak overlapping. This algorithm manages average and also benefit for Icc peak as well, if the GO dice are staggered. The priority can also be added to this average Icc management flow. After N dice are determined to GO, if some dice has high priority to GO, then issue GO to those priority dice first. If the number of priority dice is more than N dice, then just choose the first N dice among the priority to GO, then migrate the pointer to that last die. If the number of priority dice is less than N die, then issue the rest of GO dice to none priority dice at lower pointer position.

Next, controller management is considered further. As noted above with respect to FIG. 12, toggle mode current can be taken into account for the Icc index estimation. Part of the Icc budget is consumed by the IO interface toggling. To fully account for all current consumption, the controller should take all draws, including the bus, the IO interface, and the controller, into the Icc index budgeting to arbiter since one set of IO toggling can consume a relatively large amount of current. The NAND chips have internal data bus toggling in during transmission, so an extra Icc index can also be factored in for this: for example, this could be implemented on the controller side by having an extra ICC index for transmission enable budgeted.

With respect to the design implementation on the NAND memory chips, the state machine cycles need to be defined and each assigned an Icc index. A flag can also be assigned for a certain time at the end each cycle. The Icc index preferably will go through the status data path. Broadcast commands need to be defined for fetching the Icc indices and issuing any needed pause commands. It is also needed to define the cycle delay to output data depending on Chip address. Further, it is needed to implement the PAUSE interval (of, say, 5 us) and the automatic resume.

Peak Current Reduction with Weighting

The preceding section presented methods for limiting total peak current, the exemplary embodiment using a round robin algorithm. However, in some conditions the pure round robin arrangement may not produce the best performance; for example, the load per die is not equal, with some die having to work harder, or the speed of each NAND die may not be equal as some word line are slower and others faster.

Figure 18:
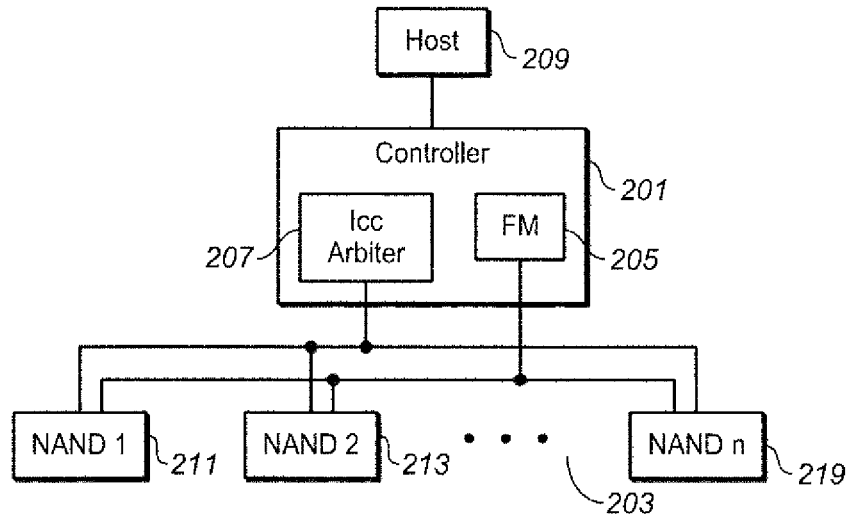
FIG. 18 is a schematic system overview when as Icc arbiter is incorporated.

FIG. 18 considers the system described above with respect to FIG. 3 in more detail. As before, the controller 201 of FIG. 18 is connected over bus 203 with multiple of flash memory dice 211, 213, . . . , 219. The controller includes a flash management unit (FM) 205 and an Icc arbiter unit 207. The FM 205 associates a physical address in one of the NAND dice to each logical address (received from a host 209) and performs all NAND operations through the existing NAND bus 203. The Icc arbiter 207 and the dice 211, 213, . . . , 219 can communicate using the main IO bus, as described in the exemplary embodiment above, or using an additional bus. Here this is shown as a separate line for purposes of discussion. As discussed in more detail above, the Icc arbiter 207 can read out the current demand for the coming state from each chip based on the Icc indices and issue pause commands accordingly. The exemplary round robin arrangement may not produce optimal results whenever the load per die is not equal or the speed of the memory dice differ significantly.

Figure 19:
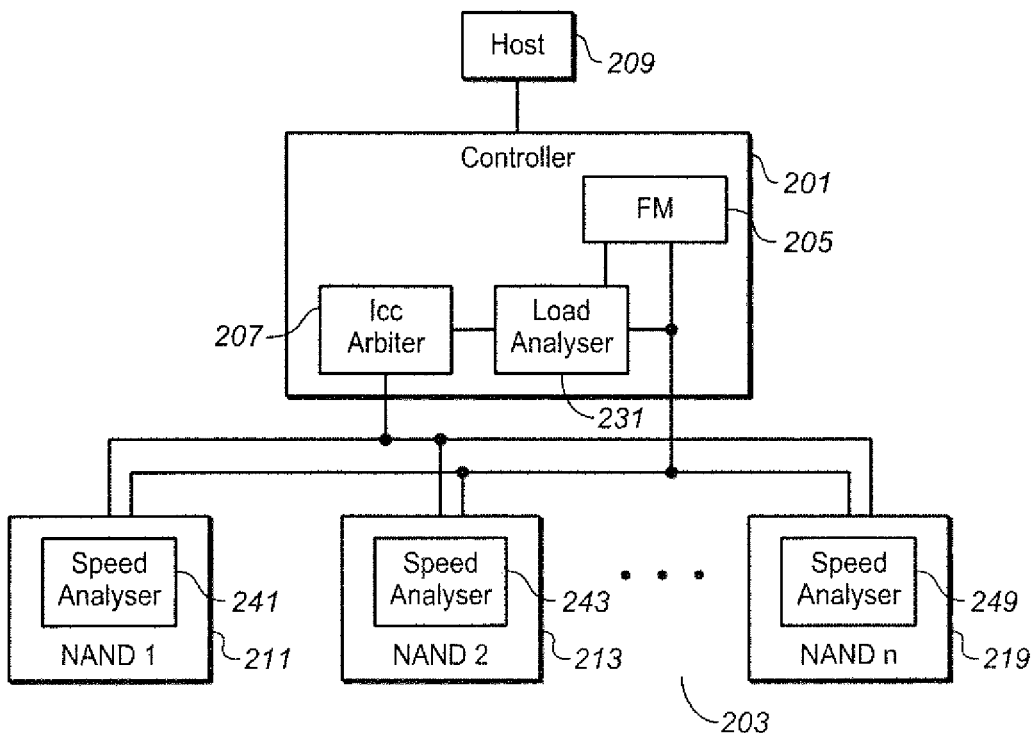
FIG. 19 is a schematic system overview when a load analyzer is incorporated into the system.

This section presents a peak current detection mechanism with a weighted round robin algorithm for distributing the load. The exemplary embodiment uses inputs from 2 sources: a mechanism in the NAND controller which identifies the load per die; and a mechanism in the NAND which indicates the current speed of the die. FIG. 19 illustrates an exemplary embodiment for such a system. The exemplary embodiment adds two new devices (units) to the previous approach, which can be implemented as dedicated element or incorporated into an existing controller and the state machines on the memory devices. The first is a Load Analyzer 231, which is preferably located near the FM device 205, and is also in communication with the Icc arbiter 207. Since the FM device 205 associates physical addresses in the NAND chips with the logical addresses received from the host 209, the load on each of the dice may be estimated by analysis of the commands from the FM 205 to the NAND units, and in particular by analyzing the history of the commands. The Load Analyzer 231 can taps the bus between the FM 205 and the memory devices 211, 213, . . . , 219, and providing it with access to the history of read/write commands from which the load may be estimated.

The second feature which is added to each of the NAND circuits is a Speed Analysis unit 241, 243, . . . , 249. This device tracks the relative speed of the current word line or block and communicates thus to the arbiter 207. The Icc arbiter logic 207 is configured to use the information from the Load Analyzer 231 and the Speed Analysis devices 241, 243, 249 to send PAUSE commands in a more optimal way than the ordinary round robin fashion.

According to one embodiment, the Load Analyzer 231 device operates by partitioning the time line into small time units. For each time unit the Load Analyzer 231 computes the load on each of the dice. The load may be computed in terms of the number of bits per time unit which were read and written to each die, or the number of operations (read/write commands) performed by each die. Also the load may be computed as a predefined function of both parameters (the number of bits, and the number of operations). The load analysis may be performed based on the history of commands which were already executed. Alternatively, the load analysis may be performed based on the data and operations, which are in the queue of the FM 205 waiting to be executed. The FM 205 may include a memory device, denoted as host cache, for temporary storage of the queue. The load analyzer 231 may also have visibility to the FM host cache and see in advance if excess commands are being accumulated which are going to be routed to one of the dies. In this case the load is not only analyzed after the commands are sent to the NAND, but can be detected in advance before the commands are sent (during an accumulation phase).

Speed analysis of each memory die may be done either in addition to the load analysis, or independently from the load analysis. The speed analysis may be carried by each of the dice, which determine the status of the read and write commands that were received by the die. The speed may also be analyzed in advance; that is, the speed for a certain word line may be analyzed in the first phases of the word line programming, or possibly from history of the word line (or word line group), thus anticipating in advance the expected performance of the NAND before it actually happens.

Figure 20:
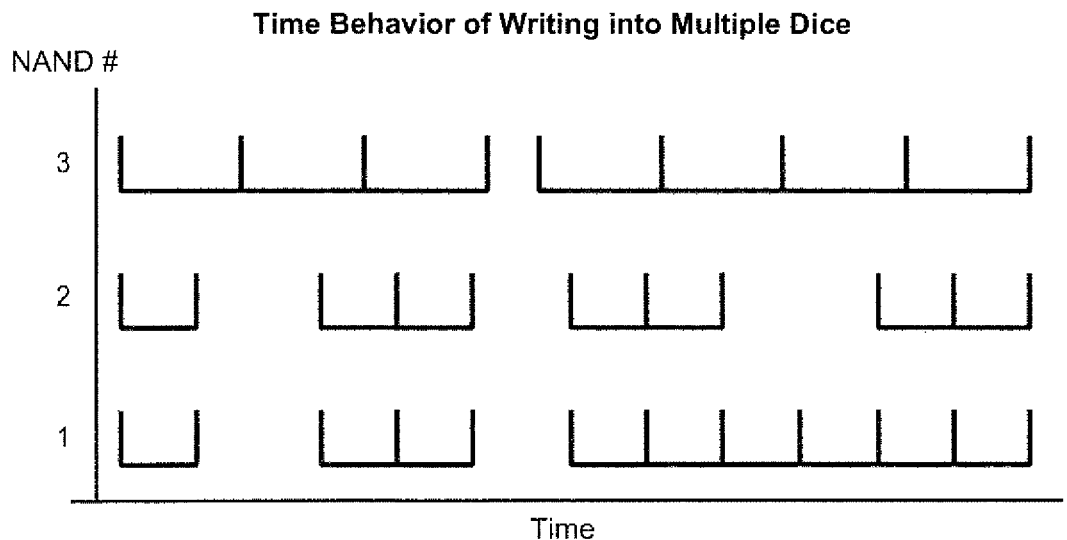
FIG. 20 illustrates the time behavior of writing into multiple dice.

Since the slowest die may determine the performance of the system, it may be better to pause the faster dice with a larger probability than pausing the slower dice. This is illustrated in FIG. 20, which is an illustration of a file being written to several dice, where some are faster than the others. Each of the open boxes represents the time required for storing an equal amount of data on each of the dice. In the illustration the NAND die number 3 is slower than the others, therefore in order to minimize the total time required for storing a file it would be desired to apply fewer PAUSE commands to the third NAND, and apply more commands to the NAND die numbers 1 and 2. As the assignment of storing the file will be achieved only after the last sector is stored in the flash, the priorities for applying the PAUSE commands should be calculated with this target in mind.

The Icc Arbiter 207 can receive the information from the dice regarding the expected current in the next step based on the load analysis and the speed of each die. The arbiter may compute which dice will be paused in the next step based on this information. For example, in a system containing only two memory dice, where the first die is loaded twice than the second die, where the limit on the current is seldom exceeded, and all other parameters being equal, the arbiter may send PAUSE commands only to the second die, and never pause the first die. The die which is less loaded will be able to compensate for the less frequent PAUSE commands by a slight increase in the load, and from a system perspective the long term performance will not be affected.

If the limit on the current is frequently exceeded, then the arbiter may compute the PAUSE commands in a different way, such that some of the PAUSE commands will be sent to the first die and some will be sent to the second die. The ratio between the two sequences will be computed to optimize the system performance. Another example is an example where the first die is twice as fast as the second die (all other parameters being equal): In this case it is better to PAUSE the faster device (in this example the first die) until the second device catches up. In mixed cases, (where there is a difference in both die load, and die speed) the computation of the arbiter will be done with a target of maximizing the system performance.

According to another set embodiments, this process can be done by associating weights to each of the NAND chips and applying the PAUSE commands according to the weights. For example, a reference set of weights for a system comprising N dice, may be $\{1/N, 1/N, \ldots, 1/N\}$. Each of the weights may be modified according to the load and speed of die associated with the weight. A typical modification may have the form:

$$1/N \cdot (1 + K_1(SF_i - 1) - K_2(LF_i - 1)),$$

where $K_1$ and $K_2$ are normalizing factors which will either be predefined or computed dynamically; and $SF_i$ is a Speed Factor for die i, where SF=1 for a normal speed NAND, greater than 1 for a fast NAND, and less than 1 for a slow NAND. $LF_i$ is a similar parameter dealing with the load on each memory die: It is 1 for a normal load NAND die, greater than 1 for a heavily loaded die, and smaller than 1 for less loaded die.

Whenever SF=LF=1, the weights become uniform weights and the peak current control converges to a basic round robin method; however, when one die is faster and less loaded than others, the weight for that die will be higher such that it will receive PAUSE commands more frequently than slower and more loaded dies. Typically the weights will be normalized such that their sum will always be 1. The weights may be dynamic and change according to changes in the load and speed of the NAND units. The controller can continuously monitor the load and the speed of the NAND units and the weights may be corrected accordingly.

The Icc arbiter may compute a deterministic sequence of indices of the NAND devices, where each index appears in the sequence in correspondence with the probability of having to PAUSE the device, should the requests for the next step current from the NANDs exceed the limit on the current. Each NAND device will be paused according to its appearance on this sequence. Alternatively, the arbiter may associate weights to each of the NAND, and whenever a PAUSE is required, the arbiter may randomly select an index of the NAND device to be paused, where the random selection will be performed according to predefined weights, such that the appearance of the indices in any long enough sequence of PAUSE commands will be approximately the same as in the deterministic case.

Figure 21:
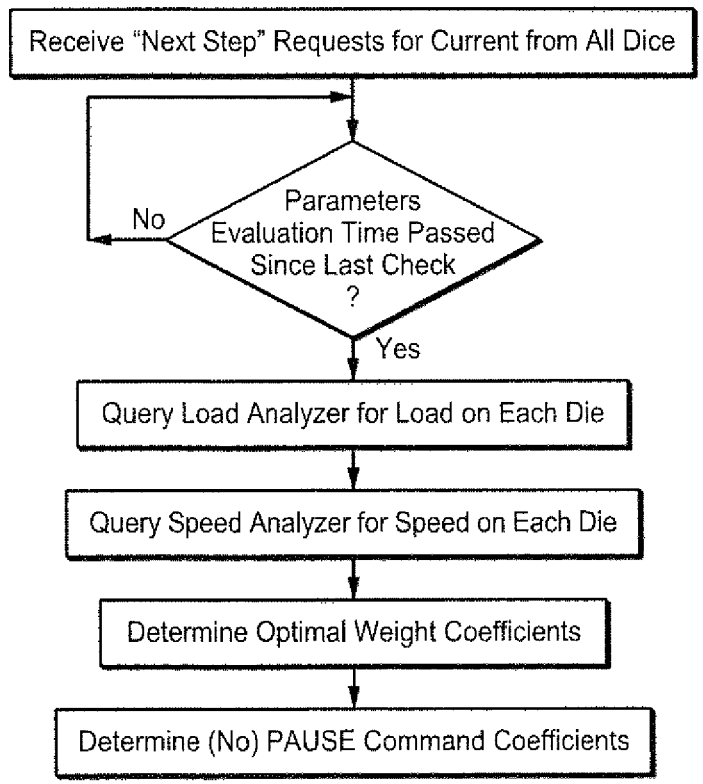
FIG. 21 is an exemplary flow chart for a weighted process for determining of PAUSE commands.

An exemplary data flow algorithm that can be implemented by the arbiter is depicted in FIG. 21. In this example, both the load and speed analyzer are queried. When these queries are both done, they can be done in either order or concurrently. In all the examples considered above the weights (representing the priorities) were computed internally in the memory system without any involvement of the host.

In systems using High Priority Interrupt (HPI) protocol the host can send an HPI, which is "immediate stop" request. (In SCSI a similar limited capability exists.) This is required to quickly abort a running command, send another urgent request with higher priority (for instance to enable smaller latencies on demand paging) and then continue with the original aborted command. These HPI requests may be an additional source influencing weights values. However, in typical memory systems this influence will be minimal since the host protocol is usually either normal priority or high priority. In systems that present a finer granularity in the host protocol, a wider functionality of priorities may be incorporated to the algorithms.

Conclusion

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

The invention claimed is:

1. A non-volatile memory system comprising:
a plurality of non-volatile memory integrated circuits, each including:
one or more memory arrays of non-volatile memory cells;
read and write circuitry connected to the one or more memory arrays; and
a state machine connected to the read and write circuitry, wherein the state machine assigns an index corresponding to an amount of current expected to be drawn for each of one or more upcoming operations of the plurality of non-volatile memory integrated circuits prior to initiation thereof based on a phase of the state machine;
a controller integrated circuit to control transfer of data between the plurality of non-volatile memory integrated circuits and a host device that is connected to the non-volatile memory system and to manage storage of data in the non-volatile memory system;
a bus structure connected to the controller integrated circuit and the plurality of non-volatile memory integrated circuits for the transfer of data and commands therebetween; and
arbitration logic connected to receive the index assigned by the state machine, wherein the arbitration logic can selectively issue pause commands to the plurality of non-volatile memory integrated circuits based upon the index in order to maintain current used by the non-volatile memory system under a first value.

2. The non-volatile memory system of claim 1, wherein the arbitration logic is on the controller integrated circuit.

3. The non-volatile memory system of claim 1, wherein the arbitration logic is on one of the plurality of non-volatile memory integrated circuits.

4. The non-volatile memory system of claim 1, wherein the state machine assigns the index based on a relative amount of current drawn by expected phases of scheduled operations, wherein a higher index corresponds to a greater expected current.

5. The non-volatile memory system of claim 4, wherein bit line charging is a high index phase.

6. The non-volatile memory system of claim 4, wherein a sense phase is a medium index phase.

7. The non-volatile memory system of claim 4, wherein a data transfer is a high index phase.

8. The non-volatile memory system of claim 4, wherein the index includes a priority value, wherein the priority value is used in determining the pause commands.

9. The non-volatile memory system of claim 4, wherein the index includes an indication of whether the upcoming operations are read or write operations, wherein the indication is used in determining the pause commands.

10. The non-volatile memory system of claim 4, wherein the index includes a cycle number for write operations, wherein the cycle number is used in determining the pause commands.

11. The non-volatile memory system of claim 1, wherein the index includes an indication of whether an operation is not pausable.

12. The non-volatile memory system of claim 1, wherein the pause commands are issued based on a round robin algorithm.

13. The non-volatile memory system of claim I, wherein the arbitration logic orders the plurality of non-volatile memory integrated circuits based on the index, wherein the pause commands are issued based on the order.

14. The non-volatile memory system of claim 1, wherein the arbitration logic includes the amount of current used in the bus structure in determining to issue the pause commands in order to maintain the current used by the non-volatile memory system under the first value.

15. The non-volatile memory system of claim 1, wherein the arbitration logic further includes the amount of current used in the controller integrated circuit in determining the issuing of the pause commands in order to maintain the current used by the non-volatile memory system under the first value.

16. The non-volatile memory system of claim 1, wherein the controller integrated circuit includes an Input/Output (IO) interface to transfer data between the non-volatile memory system and the host device, wherein the arbitration logic includes the amount of current used in the IO interface in determining to issue the pause commands in order to maintain the current used by the non-volatile memory system under the first value.

17. A non-volatile memory system comprising:
a plurality of non-volatile memory integrated circuits, each including one or more memory arrays with read and write circuitry connected thereto operated according to a state machine formed thereupon, wherein the state machine assigns an index corresponding to an amount of current expected to be drawn for upcoming operations of the plurality of non-volatile memory integrated circuits based on a phase of the state machine;
a controller integrated circuit to control transfer of data between the plurality of non-volatile memory integrated circuits and a host device that is connected to the non-volatile memory system and to manage storage of data in the non-volatile memory system;
a bus structure connected to the controller integrated circuit and the plurality of non-volatile memory integrated circuits for the transfer of data and commands therebetween; and
arbitration logic connected to receive the index assigned by the state machine, where the arbitration logic can selectively issue pause commands to the plurality of non-volatile memory integrated circuits based upon the index in order to maintain current used by the non-volatile memory system under a first value, wherein the arbitration logic is on the controller integrated circuit and the controller integrated circuit further includes load analyzing circuitry to determine a load for each of the plurality of non-volatile memory integrated circuits, and wherein the arbitration logic includes the load for each of the plurality of non-volatile memory integrated circuits in determining the issuing of the pause commands in order to maintain the current used by the non-volatile memory system under the first value.

18. A non-volatile memory system comprising:
a plurality of non-volatile memory integrated circuits, each including one or more memory arrays with read and write circuitry connected thereto operated according to a state machine formed thereupon, wherein the state machine assigns an index corresponding to an amount of current expected to be drawn for upcoming operations of the plurality of non-volatile memory integrated circuits based on a phase of the state machine;
a controller integrated circuit to control transfer of data between the plurality of non-volatile memory integrated circuits and a host device that is connected to the non-volatile memory system and to manage storage of data in the non-volatile memory system;
a bus structure connected to the controller integrated circuit and the plurality of non-volatile memory integrated circuits for the transfer of data and commands therebetween; and
arbitration logic connected to receive the index assigned by the state machines, where the arbitration logic can selectively issue pause commands to the plurality of non-volatile memory integrated circuits based upon the index in order to maintain current used by the non-volatile memory system under a first value, wherein each of the plurality of non-volatile memory integrated circuits further includes speed analysis circuitry to determine a relative speed of operation thereof, and wherein the arbitration logic includes the relative speed of operation for each of the plurality of non-volatile memory integrated circuits in determining the issuing of the pause commands in order to maintain the current used by the non-volatile memory system under the first value.

* * * * *